United States Patent
Kern et al.

(10) Patent No.: US 12,413,250 B2
(45) Date of Patent: Sep. 9, 2025

(54) ERROR CORRECTION WITH ERROR CODE FOR A STRING OF SYMBOLS

(71) Applicant: Infineon Technologies AG, Neubiberg (DE)

(72) Inventors: Thomas Kern, Aschheim (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 71 days.

(21) Appl. No.: 18/487,267

(22) Filed: Oct. 16, 2023

(65) Prior Publication Data
US 2024/0146333 A1 May 2, 2024

(30) Foreign Application Priority Data
Oct. 14, 2022 (DE) .................... 10 2022 126 958.2

(51) Int. Cl.
*H03M 13/00* (2006.01)
*H03M 13/15* (2006.01)

(52) U.S. Cl.
CPC ... *H03M 13/1515* (2013.01); *H03M 13/1575* (2013.01); *H03M 13/6516* (2013.01)

(58) Field of Classification Search
CPC ............. H03M 13/1515; H03M 13/15; H03M 13/1575; H03M 13/6516
See application file for complete search history.

(56) References Cited

U.S. PATENT DOCUMENTS

| | | | |
|---|---|---|---|
| 7,024,611 B2 * | 4/2006 | Chen | H04L 1/1816 714/751 |
| 7,076,724 B2 * | 7/2006 | Cole | H04L 25/4908 714/784 |
| 7,231,576 B2 * | 6/2007 | Tanaka | G11B 20/1833 714/755 |
| 9,270,299 B2 * | 2/2016 | Luby | H04L 1/0086 |
| 9,805,771 B2 | 10/2017 | Loibl et al. | |
| 11,157,352 B2 | 10/2021 | Kern et al. | |
| 11,171,670 B2 * | 11/2021 | Lee | H03M 13/2906 |
| 11,323,138 B1 * | 5/2022 | Shin | H03M 13/45 |
| 11,330,705 B2 * | 5/2022 | Qian | G01R 31/2813 |
| 11,974,223 B2 * | 4/2024 | Park | H04W 52/0229 |
| 2020/0104206 A1 | 4/2020 | Kern et al. | |

* cited by examiner

*Primary Examiner* — Esaw T Abraham
(74) *Attorney, Agent, or Firm* — Eschweiler & Potashnik, LLC

(57) ABSTRACT

An approach to correcting errors in a string of symbols is proposed, in which the string of symbols is transformed by a transformation τ into a first group of symbols and into a second group of symbols, and in which the group of symbols that has fewer erroneous symbols than the other group is corrected using a first error code.

20 Claims, 4 Drawing Sheets

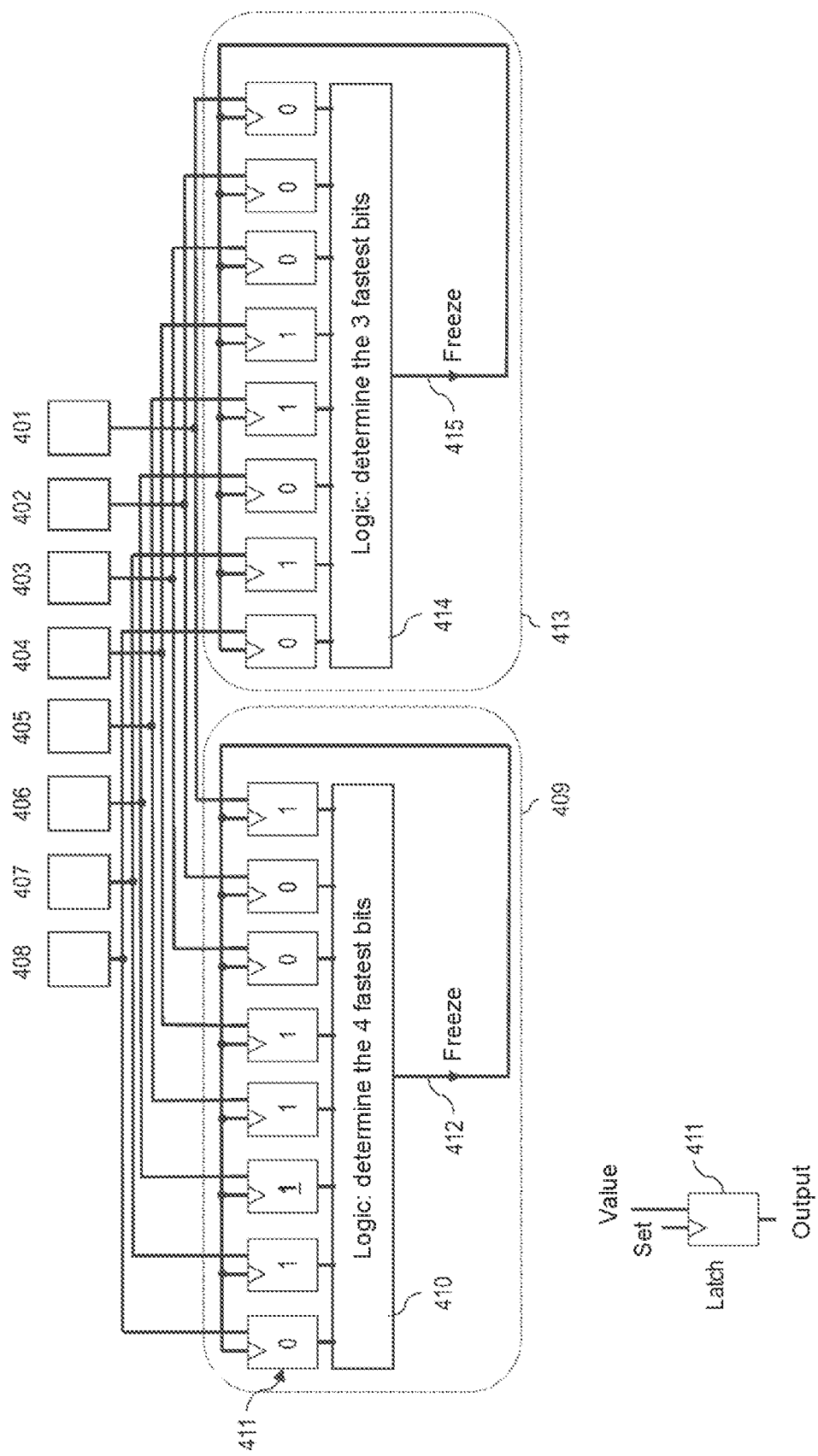

ERROR CORRECTION WITH ERROR CODE FOR A STRING OF SYMBOLS

This application claims priority to German Patent Application 10 2022 126 958.2, filed on Oct. 14, 2022. The contents of the above-referenced Patent Application is hereby incorporated by reference in its entirety.

FIELD

It is known that bit errors in binary data, e.g. strings of multiple bits, can be corrected and/or detected using error codes.

An error code is either an error-correcting code, an error-detecting code or a combination of an error-detecting and error-correcting code.

BACKGROUND

One object is to improve the known solutions and, in particular, to develop an approach that allows a more efficient error correction to be performed.

This object is achieved by the features of the independent claims. Preferred embodiments are disclosed in particular in the dependent claims.

A method for error correction in a string of symbols is proposed, in which the string of symbols is transformed by a transformation $\tau$ into a first group of symbols and into a second group of symbols; in which the group of symbols that has fewer erroneous symbols than the other group is corrected using a first error code.

One advantage is that the correctable errors are divided between the two groups of symbols, also known as words, and thus fewer strong error codes or fewer check bytes are sufficient to perform the correction. This sub-division means that R byte errors in the string of symbols are corrected by means of an error code that can correct only N byte errors (N<R).

In addition, errors that change a codeword to another (incorrect) codeword can be corrected.

The string of symbols can be a string of bits or bytes that are read from a memory and may contain errors.

A byte comprises a plurality of bits.

If both groups have the same number of errors, one of the groups can be corrected.

In a refinement, the first error code is a byte-error-correcting error code.

SUMMARY

In a further refinement, the first error code is an N-byte error-correcting Reed-Solomon code over a Galois field $GF(2^q)$, where q is the number of bits of a symbol read out from the first group and the second group.

For example, N=1 can apply, and the Reed-Solomon code can have at least two syndrome components. In another exemplary embodiment, N>2 can apply and the Reed-Solomon code has at least 4 syndrome components.

In another extension, each of the symbols comprises at least one of the following: a byte, a multi-valued component, a value from a specified value range.

In a refinement of the method, the method comprises the following steps: carrying out a transformation T in which a number of L symbols B is transformed into a number of L codewords of a second error code, storing the L codewords of the second error code in memory cells of a memory, determining the string of symbols by reading L symbols from the memory cells, wherein the L symbols, provided they are found to be error-free in relation to the second error code, correspond to the L codewords of the second error code, carrying out the transformation $\tau$, by means of which the L symbols read out are transformed into the first group of symbols and into the second group of symbols.

In a refinement, the L symbols B form a codeword of the first error code.

In a further refinement, in the event of an error the transformation $\tau$ is applied taking codewords of the second error code into account.

In a further refinement, in the event of an error the transformation $\tau$ is applied taking into account codewords of the second error code that have a small distance from the erroneous symbol.

The distance here refers to an error distance, for example the Hamming distance. For example, if an erroneous symbol is not a codeword because a single bit is incorrect, then an error set may be defined which contains all or some of the codewords that result from changing a single bit in the erroneous symbol. The set of errors can be limited based on at least one secondary condition. Such a secondary condition can be determined, for example, by taking the time domain into account.

The Hamming distance (also referred to as the edit distance) of two symbols corresponds to the number of different digits.

In a further refinement, in the event of an error the transformation $\tau$ is applied taking into account a codeword of the second error code, which differs from the erroneous symbol by only one bit.

In a further refinement, in the event of an error the transformation $\tau$ is applied taking into account a codeword of the second error code which has the smallest Hamming distance from the erroneous symbol.

In a further refinement, the second error code is a parity code or an m-from-n code with $1 \leq m < n$.

In a further refinement, the string of symbols is transformed into the first group of symbols and into the second group of symbols, the first group of symbols being different from the second group of symbols, if a symbol of the string of symbols is not a codeword of the second error code and therefore at least one error is present.

In an extension of the invention, a first error syndrome is determined for the first group of symbols and a second error syndrome is determined for the second group of symbols, using the first error syndrome and/or using the second error syndrome it is determined whether the first group of symbols or the second group of symbols is corrected.

This is advantageous in that, due to the transformation of the string of symbols into the two groups of symbols, both types of error are corrected, namely those in which a symbol of the string of symbols does not constitute a codeword of the second error code, as well as errors in which a symbol of the string of symbols has been falsified to an erroneous codeword of the second error code.

For example, it may be the case that N=M/2+Q, or R=M+Q where N is the number of errors that can be corrected using the first error code, M is the number of errors in which a symbol of the string of symbols has been falsified into a non-codeword of the error code, Q is the number of errors in which a symbol of the string of symbols has been falsified into another (incorrect) codeword of the second error code, and R is the number of symbol errors.

For example, 2·N check bytes may be present, and an error syndrome can be determined from 2·N syndrome components, each having q binary components.

Optionally, the read-out bits can be determined in a time domain. In the time domain, the m fastest bits and/or the m−r fastest bits can be determined (with 1≤r<m). These bits can be used to determine the transformation.

Another option is for the bits to be read from memory using at least one reference value.

A device for error correction in a string of symbols is also proposed, comprising a processing unit which is configured to carry out the steps of the method according to the present description.

In a refinement, the device is or comprises a memory or a storage system.

The solution presented here also specifies a computer program product that can be loaded directly into a memory of a digital computer, comprising program code parts which are configured for carrying out steps of the method described here.

The processing unit mentioned here may be embodied, in particular, as a processor unit and/or as an at least partially hard-wired (e.g. logic) circuit arrangement, which is configured, for example, in such a way that the method can be carried out as described herein. Said processing unit can be or comprise any type of processor or calculator or computer with the necessary peripheral devices (memory, input/output interfaces, input and output devices, etc.). The above remarks relating to the method apply to the device as appropriate. The device can be embodied in one component or divided into a plurality of components.

Also, the above-mentioned object is achieved by means of a system comprising at least one of the devices described here.

The properties, features and advantages of the present invention described above and the manner in which these are achieved are also described in conjunction with the following schematic description of exemplary embodiments, which are explained in more detail in conjunction with the drawings. For clarity of exposition, identical or equivalent functional elements are labeled with the same reference numeral.

BRIEF DESCRIPTION OF THE DRAWINGS

FIG. 4 shows a schematic image for illustrating the processing of bit groups.

Figure 1:
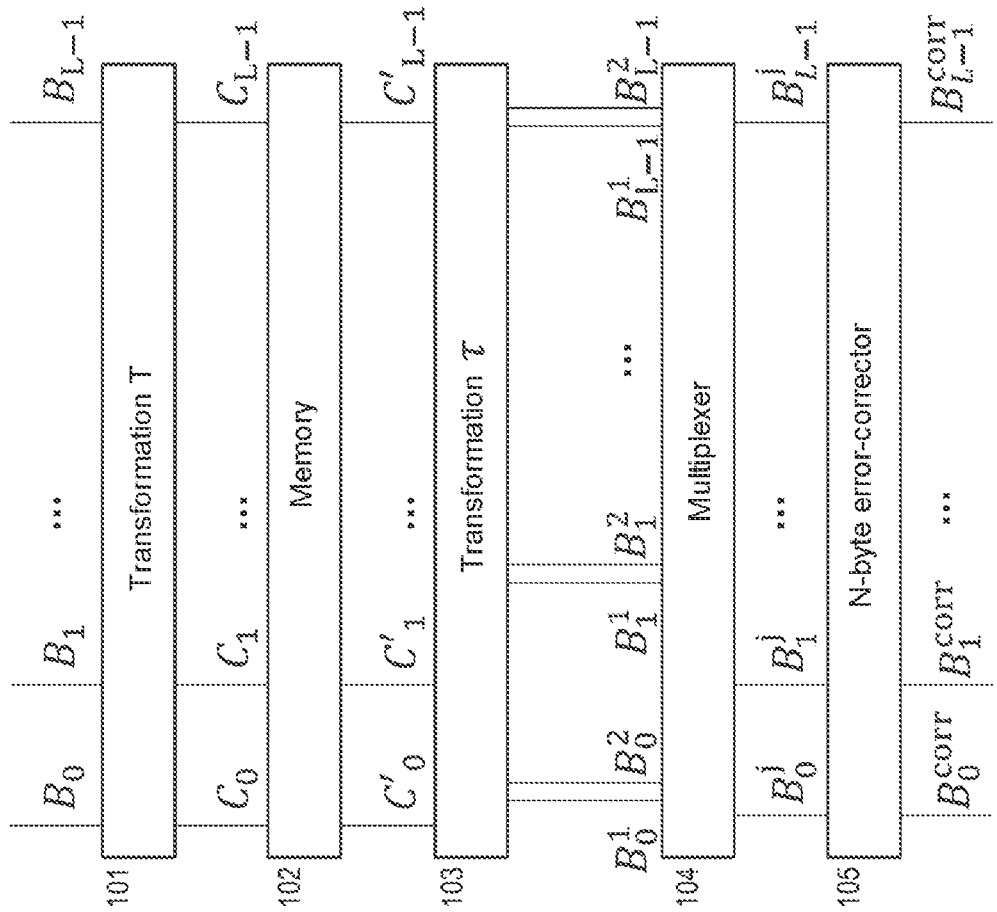
FIG. 1 shows a block diagram of an exemplary design of the approach described here.

The embodiments described in the present invention relate in particular to an improvement in the reliability of data, which in the error-free case form a codeword of bytes of a first error code. A byte contains q bits with q≥2.

These bytes can be designated by $B_0, B_1, \ldots$ or by $B_i$, where i is a positive integer.

A byte $B_i$ to be stored is transformed by a transformation T into a codeword $C_i$ of a second error code. This codeword $C_i$ can be stored in a memory (in particular in memory cells of the memory). If the codeword $C_i$ of the second error code contains n bits, the codeword of the second error code can also be referred to as an n-bit byte, or n-bit codeword and stored in n memory cells, where n is a positive integer greater than 1.

If n bits are read from memory, the read bits can correspond to the previously written codeword, due to an error (of at least one bit), represent a bit string that is not a codeword of the second error code (also referred to as a non-codeword error or nC-error) or due to an error of at least two bits, represent a bit string that is an incorrect codeword of the second error code (also referred to as an erroneous codeword error or fC-error).

If an n-bit word is read from memory, it is possible to determine whether it is a codeword or a non-codeword of the second error code:

A codeword of the second error code is transformed by a transformation τ into at least one first q-bit byte and one second q-bit byte, which are identical to each other.

A non-codeword is transformed into at least one first q-bit byte and one second q-bit byte, both of which are different.

The first q-bit bytes form a first q-byte word $W^1$ and the second q-bit bytes form a second q-byte word $W^2$. Errors in the first or second q-byte word $W^1$ or $W^2$ are corrected and/or detected using the first error code. The first error code can be an N-byte error-correcting code.

When reading the memory cells, errors can be detected using the second error code, which falsify a codeword of the second error code into a non-codeword of the second error code.

An error that falsifies a codeword of the second error code into a non-codeword of the second error code is referred to in the following as a non-codeword error (nC-error). Since a non-codeword of the second error code is transformed into two different q-bit bytes, each nC-error corresponds to two different q-bit bytes.

An error that falsifies a first codeword of the second error code into a different codeword of the second error code is referred to as an erroneous codeword error (fC-error). The fC-error cannot be detected using the second error code. However, it is possible for the fC-error to be corrected or detected by means of the first error code.

The first error code is an error syndrome with syndrome components, where a syndrome component may comprise q bits. Using the syndrome components of the first error code, it is determined whether the first q-byte word read out will be corrected.

Using the syndrome components of the first error code, it is also determined whether the second q-byte word read will be corrected.

The following text considers an example of the case where two identical q-bit bytes are assigned to a codeword of the second error code and two different q-bit bytes are assigned to a non-codeword. The following applies:

for an fC-error:

A codeword of the second error code, which was erroneously generated by an fC-error from another codeword of the second error code, is assigned two equal transformed q-bytes by the transformation τ, but which are erroneous. They do not match the transformed original codeword. The fC-error therefore results in a byte error in both $W^1$ and $W^2$.

for an nC-error:

A non-codeword of the second error code, which has arisen erroneously from a codeword of the second error code due to an nC-error, is assigned two different transformed q bytes by the transformation τ, wherein one of the two q-bit bytes matches the error-free codeword. The nC-error results in a byte error either in $W^1$ or in $W^2$ but not in both $W^1$ and $W^2$.

If M nC-errors are present, then the first q-byte word read has $M_1$ byte errors and the second q-byte word read has $M_2$ byte errors. The following is true:

$$M_1 + M_2 = M$$

and $M_1$ or $M_2$ is less than or equal to M/2.

The byte-error correction can be carried out using the first error code, which is an N-byte error-correcting error code with N=M/2.

If both M nC-errors and Q fC-errors are present, the following is true: the first q-byte word read out has $M_1+Q$ byte errors and the second q-byte word read out has $M_2+Q$ byte errors and $$N=M/2+Q$$

The correction can then be made using the first error code, provided that this is an N-byte error-correcting error code with N=M/2+Q.

In many applications, the number Q of fC-errors can be small, for example 1 or 2, so that Q<M/2. In this case, the number N of the maximum byte errors that can be corrected using the first error code can even be less than M.

nC-errors can occur, for example, when reading data from memory cells. If an nC-error is detected that falsifies a codeword of the second error code into a non-codeword, the byte-error position in which the corresponding byte is falsified can be determined. In addition, it may be known that only a predetermined number of bits of the byte of the detected nC-error are erroneous. As an example, only one bit or two bits of the codeword may be corrupted. This information can be advantageously used for determining the transformation τ, so that a non-codeword of the second error code must only be assigned two different read out q-bit bytes by the transformation τ.

This reduces the effort required to correct byte errors. For example, an error code can have a first number of data bytes and a second number of check bytes. For example, an N-byte error-correcting Reed-Solomon code can be used as the error code, in which 2·N check bytes are required for the correction of N byte errors. Because only one N-byte error-correcting error code is required to correct M byte errors, only 2·N check bytes and not 2·M check bytes are required. In some applications N≤M/2 can apply, where M/2 denotes the integer division of M by 2, so that e.g. 4/2=5/2=2.

For example, the correction of up to three erroneous bytes can be effected as 1-byte error correction with a 1-byte error-correcting error code. The error correction can be implemented in hardware and/or software.

Data bits can be grouped into groups of q bits to form a byte, wherein the groups of data bits are referred to as data bytes. Data bytes can be supplemented by check bytes in such a way that the data bytes and the check bytes form a codeword of the first error code. The first error code can be an error code that can correct N byte errors. Alternatively, the first error code can be an error code that can correct N byte errors and detect more than N byte errors. For example, the first error code can be a Reed-Solomon code.

A codeword of the first error code can be formed from the q-bit bytes $B_i$ $$B_i = B_0, B_1, \ldots, B_{L-1}$$

where L is the number of q-bit bytes of a codeword of the first error code.

A byte $B_i$ of the first error code can be transformed by a transformation T into a codeword $C_i$ $$T(B_i) = C_i = c_i^1, \ldots, c_i^n$$

of the second error code, wherein the byte $C_i$ has a number n of bits $c_i^1$ to $c_i^n$. The codeword $C_i$ of the second error code can also be referred to as an n-bit byte. The n-bit byte $C_i$ can be stored in n memory cells.

The n-bit byte $C_i$ can be a codeword of a m-from-n code that has m ones and n−m zeros, where 0≤m<n.

If the codeword of the first error code has a number L of q-bit bytes, then each of these q-bit bytes $B_0$ to $B_{L-1}$ can be transformed by the transformation T into a codeword $C_0, \ldots, C_{L-1}$ of the second error code. Thus, the codeword of the first error code is transformed into L codewords $C_0$ to $C_{L-1}$ of the second error code.

DETAILED DESCRIPTION

FIG. 1 shows a block diagram of an exemplary design of the approach described here.

A circuit for the transformation T 101 determines from a codeword of the first error code with a number L of q-bit bytes $$B_0, B_i, \ldots, B_{L-1}$$

a number L of codewords $$C_0, C_1, \ldots, C_{L-1}$$

of the second error code.

Preferably, the first error code is an N-byte error-correcting code. A codeword $C_i$ of the second error code contains n bits. For example, the second error code is an m-from-n code with 1≤m<n.

The codewords of the second error code are stored in memory 102 and read from the memory 102 as n-bit words $C'_0$ to $C'_{L-1}$. It should be noted that the words $C'_0$ to $C'_{L-1}$, for example, have erroneously arisen from the codewords $C_0$ to $C_{L-1}$ due to read errors. In other words, the words $C_0'$ to $C'_{L-1}$ may be erroneous and possibly no longer codewords of the second error code.

If $C_i = C'_i$, then no (detectable) error occurred in the stored codeword $C_i$ of the second error code during storage or during reading. If on the other hand, $C_i \neq C'_i$, an error has occurred. For example, the error could be a read error, a write error, or a memory error. One possibility is that at least one bit has been falsified due to radiation (e.g. by α particles).

Figure 2:
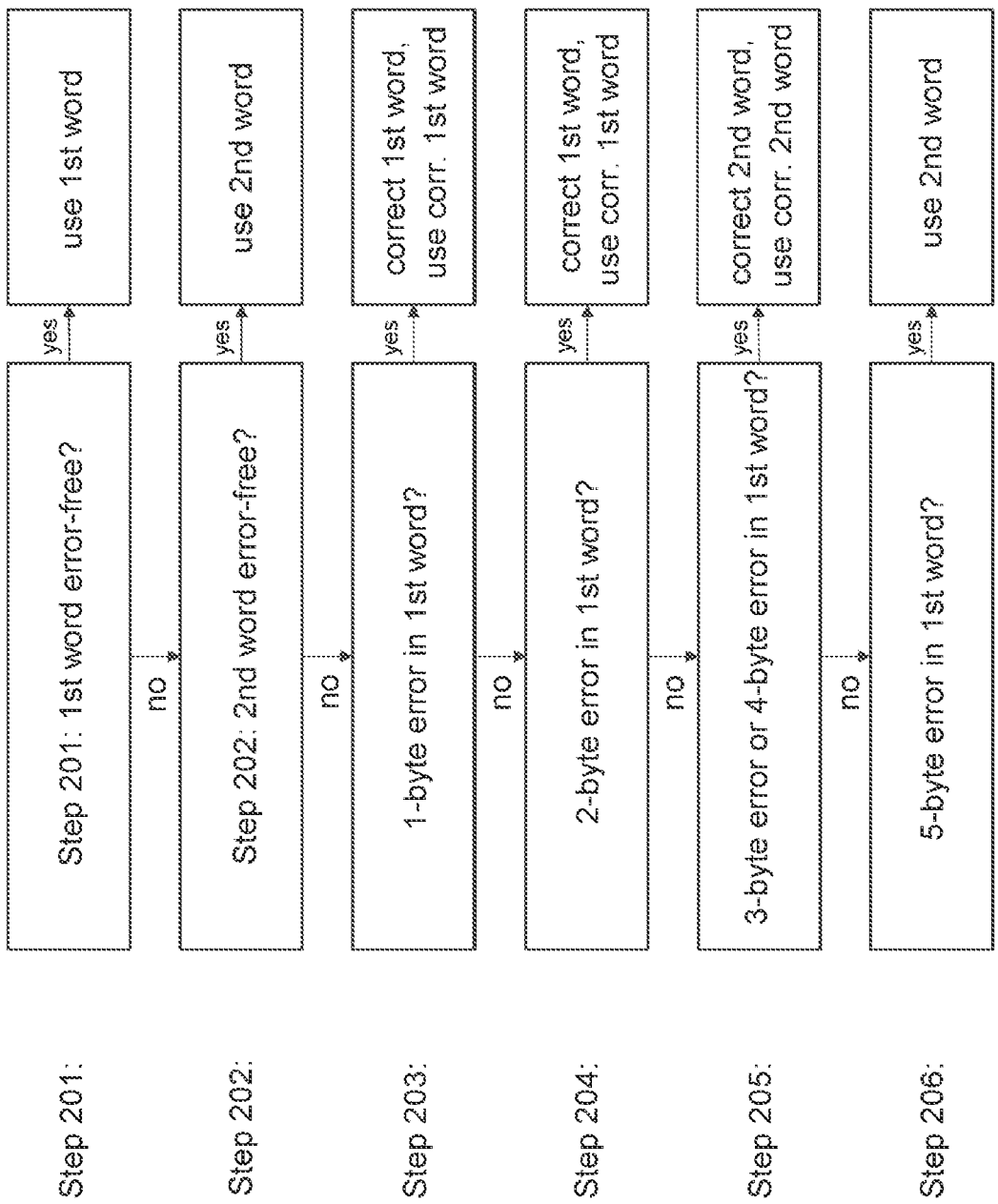
FIG. 2 shows a schematic diagram for visualizing an exemplary implementation of the error correction.

FIG. 2 shows an example of a way of correcting up to M byte errors in the n-bit words $C'_0$ to $C'_{L-1}$, where 2≤M>N applies.

The possibly erroneous n-bit words $C'_0$ to $C'_{L-1}$ are present at L inputs of a circuit for transformation τ103, each n-bits wide, which uses them to determine the first q-bit bytes $B_0^1, B_1^1, \ldots$ and second q-bit bytes $B_0^2, B_1^2, \ldots, B_{L-1}^2$. The first q-bit bytes form a first word $$W^1 = B_0^1, B_1^1, \ldots, B_{L-1}^1$$

and the second q-bit bytes form a second word $$W^2 = B_0^2, B_1^2, \ldots, B_{L-1}^2.$$

The circuit 103 determines the transformation τ, which transforms each of the read n-bit words $C'_i$ into at least two q-bit bytes $B_i^1$ and $B_i^2$.

The q-Bit bytes $B_0^1, B_1^1, \ldots, B_{L-1}^1$ and the q-bit bytes $B_0^2, B_1^2, \ldots, B_{L-1}^2$ are input at q-bit wide inputs of a multiplexer 104, which outputs the q-bit bytes $B_0^1$ to $B_{L-1}^1$, which form the first word $W^1$, or the q-bit bytes $B_0^2$ to $B_{L-1}^2$, which form the second word $W^2$, at its outputs. Thus, either the first word $W^1$ or the second word $W^2$ is provided at the outputs of the multiplexer 104.

Using an error syndrome of the first error code for the first word $W^1$ and an error syndrome of the first error code for the second word $W^2$ it is determined whether the first word $W^1$ can be corrected by the first error code and/or whether the second word $W^2$ can be corrected by the first error code.

Accordingly, the first word $W^1$ or the second word $W^2$ is output at the outputs of the multiplexer 104.

The outputs of the transformation circuit 103 are connected to corresponding inputs of an N-byte error corrector 105, which corrects up to N byte errors in the possibly erroneous q-bit bytes present at its inputs by using the first error code and provides at its outputs the corrected bytes $$B_0^{cor}, B_1^{cor}, \ldots, B_{L-1}^{cor}$$

where N<M. In the case of an M-byte error in the n-bit bytes $C'_0$ to $C'_{L-1}$, $W^1$ or $W^2$ will have fewer than M byte errors.

For example, the first error code can be a Reed-Solomon code that corrects N-byte errors. The transformation τ can be designed in such a way that it determines more than two transformed bytes for an n-bit byte $C'_i$. For example, the second error code can be a parity code that transforms a byte $B_i$ into a codeword $C_i$ such that the number of bits in $C_i$ always has an even number or always has an odd number of ones. For example, the second error code can be an m-from-n code.

An example of a transformation T of a byte $B_i$ of the first error code into a codeword $C_i$ of the second error code is shown in Table 1. Here, by way of example q=4, n=6, and m=3, so that a 4-bit byte of the first error code is transformed into a codeword of the 3-from-6 code. A codeword of the second error code is a 6-bit byte.

There are 16 4-bit bytes $B_o=0000$ to $B_{15}=1111$ and $\binom{6}{3}=20$ codewords of the 3-from-6 code, of which only 16 are used in Table 1.

In this example, the second error code is an m-from-n code with m=3 and n=6.

The first column of Table 1 shows the 4-bit bytes $B_0=0000$ to $B_{15}=1111$ and their respective binary representation. The second column shows the associated 3-from-6 codewords $C_0$ to $C_{15}$ as determined by the transformation T. The third column shows the inverse transformation $T^{-1}$ of T, which assigns the 4-bit byte $B_i$ to the corresponding codeword $C_i$ of the 3-from-6 code.

When reading out stored data, the bits of an n-bit byte $C'_i$ are read out from n memory cells. If there is no error, the n-bit byte $C'_i$ read out is equal to a codeword $C_i$ of the second error code written to the n memory cells. In the exemplary embodiment considered here, it is equal to the written codeword of the m-from-n code.

If the n-bit byte $C'_i$ is not a codeword of the second error code, there is an error in this byte. The position of the erroneous byte, which can also be referred to as the byte-error position, is thus derived purely from the fact that there is no codeword of the second error code.

TABLE 1

Transformation T and inverse transformation $T^{-1}$ of 4-bit bytes $B_i$

| | | |
|---|---|---|
| $B_o = 0000$ | $T(B_0) = 111000 = C_o$ | $T^{-1}(C_0) = B_0$ |
| $B_1 = 0001$ | $T(B_i) = 110100 = C_1$ | $T^{-1}(C_1) = B_1$ |
| $B_2 = 0010$ | $T(B_2) = 110010 = C_2$ | $T^{-1}(c_2) = B_2$ |
| $B_3 = 0011$ | $T(B_3) = 110001 = C_3$ | $T^{-1}(c_3) = B_3$ |
| $B_4 = 0100$ | $T(B_4) = 101100 = C_4$ | $T^{-1}(c_4) = B_4$ |
| $B_B = 0101$ | $T(B_5) = 101010 = C_5$ | $T^{-1}(c_5) = B_5$ |
| $B_6 = 0110$ | $T(B_6) = 101001 = C_6$ | $T^{-1}(C_6) = B_6$ |
| $B_7 = 0111$ | $T(B_7) = 100110 = C_7$ | $T^{-1}(C_7) = B_7$ |
| $B_8 = 1000$ | $T(B_8) = 100101 = C_8$ | $T^{-1}(C_8) = B_8$ |
| $B_9 = 1001$ | $T(B_9) = 100011 = C_9$ | $T^{-1}(C_9) = B_9$ |
| $B_{10} = 1010$ | $T(B_{10}) = 011100 = C_{10}$ | $T^{-1}(C_{10}) = B_{10}$ |
| $B_{11} = 1110$ | $T(B_{11}) = 011010 = C_{11}$ | $T^{-1}(C_{11}) = B_{11}$ |
| $B_{12} = 1100$ | $T(B_{12}) = 011001 = C_{12}$ | $T^{-1}(C_{12}) = B_{12}$ |

TABLE 1-continued

Transformation T and inverse transformation $T^{-1}$ of 4-bit bytes $B_i$

| | | |
|---|---|---|
| $B_{13} = 1101$ | $T(B_{13}) = 010110 = C_{13}$ | $T^{-1}(C_{13}) = B_{13}$ |
| $B_{14} = 1110$ | $T(B_{14}) = 010101 = C_{14}$ | $T^{-1}(C_{14}) = b_{14}$ |
| $B_{15} = 1111$ | $T(B_{15}) = 010011 = C_{15}$ | $T^{-1}(C_{15}) = B_{15}$ |

The (possibly erroneous) n-bit byte read out is transformed by the transformation τ into a set of k q-bit bytes $$B_i^1, B_i^2, B_i^3 \ldots, B_i^k$$

where k>2. If the n-bit byte $C'_i$ read out is a codeword of the second error code, then the q-bit bytes $B_i^1$ to $B_i^k$ are identical to one another and the following expression is true:

$$B_i^1 = B_i^2 = B_i^3 = \ldots = B_i^k = T^{-1}(C'_i).$$

If, on the other hand, the n-bit byte $C'_i$ read out is not a codeword of the second error code, then the n-bit byte read out is assigned a set of k different (possible) codewords $\{C_i^1, C_i^2 \ldots, C_i^k\}$ of the second error code and $\tau(C'_i)$ is then evaluated to $$\tau(C'_i) = T^{-1}(C_i^1), T^{-1}(C_i^2), \ldots, T^{-1}(C_i^k).$$

The codewords $C_i^1, C_i^2, \ldots, C_i^k$ can be determined such that these codewords are corrupted by an error of a specific set $\phi(C'_i)$ of errors into the non-codeword $C'_i$. For example, the set $\phi(C'_i)$ of errors can be 1-bit errors or multiple-bit errors.

For example, if the second error code is a 3-from-6 code and $C'_i$ is a non-codeword in the form of the 6-bit byte $C'_i=(110000)$ with 4 zeros and 2 ones, then for k=4 based on $C'_i$ the set of the 4 possible codewords can be determined as $$C_i^1=(111000),$$

$$C_i^2=(110100),$$

$$C_i^3=(110010),$$

$$C_i^4=(110001).$$

$\phi(C'_i)$ is the set of 1-bit errors in the bit positions 3, 4, 5, and 6. Since all other codewords of the 3-from-6 code of $C'_i$ differ by more than one bit position, there are no further codewords that could be falsified by a 1-bit error in $C'_i$. In other words, here the set $\phi(C'_i)$ of the errors for the codeword $C'_i$ is the set of 1-bit errors which can falsify a codeword of the 3-from-6 code to $C'_i=110000$.

The set of codewords that is falsified by an error of the error set $\phi(C'_i)$ into the non-codeword $C'_i$ is thus determined by:

$$\{C_i^1=(111000), C_i^2=(110100), C_i^3=(110010), C_i^4=(110001)\}.$$

The errors occurring here are 1-bit errors, for example. For the transformation τ then, using Table 1

$$T(C'_i) = T(110000) =$$
$$= T^{-1}(C_i^1), T^{-1}(C_i^2), T^{-1}(C_i^3), T^{-1}(C_i^4) =$$
$$= T^{-1}(111000), T^{-1}(110100), T^{-1}(110010), T^{-1}(110001) =$$
$$= B_0, B_1, B_2, B_3$$

For the codeword $C'_i(111000)$ $$\tau(C'_i) = \tau(110000) = B_0, B_0, B_0, B_0.$$

If it is possible to limit the number of erroneous bits in an n-bit byte $C'_i$, which is not a codeword of the second error code, to two bits, for example, then only two q-bit bytes $B_i^1$ and $B_i^2$ are assigned to the non-codeword $C'_i$ of the second error code by the transformation τ.

For example, if $C'_i$=110000 and it can be determined that the third and fifth bits are not erroneous, then for this non-codeword only the set of codewords {$C_i^1$=110100, $C_i^2$=110001} is determined and the following is true, provided only 1-bit errors occur:

$$T(C_i^1) = T(110000) = T(C_i^1), T(C_i^2) =$$
$$= T^{-1}(110100) = T^{-1}(110001) = (110100)$$
$$= B_1, B_3.$$

The set $\phi(C'_i)$ then consists of a 1-bit error in the fourth or sixth bit for this non-codeword.

The following text describes by way of example that, if $C'_i$ is a codeword of the second error code, the transformation τ determines two equal q-bit bytes. If, on the other hand, $C'_i$ is a non-codeword of the second error code, then the transformation τ determines two unequal q-bit bytes.

A transformation τ transforms an n-bit byte $C'_i$ read from each of the n memory cells into at least two q-bit bytes $B_i^1$ and $B_i^2$. As previously explained, as an option the transformation τ can transform an n-bit byte read from n memory cells into more than two q-bit bytes.

As an example, the case will be considered in which the byte $C'_i$ read out is transformed into a first q-bit byte $B_i^1$ and into a second q-bit byte $B_i^2$ by the transformation τ.

The first transformed q-bit byte $B_i^1$ is equal to the second transformed q-bit byte $B_i^2$ if the n-bit byte $C'_i$ read out is a codeword of the second error code. In this case:

$B_i^1 = B_i^2 = T^{-1}(C'_i).$

In this example, the second error code is an m-from-n code with m=3 and n=6.

The first q-bit bytes $B_0^1$ to $B_{L-1}^1$ determined by the transformation τ form a first transformed word $W^1$, and the second q-bit bytes $B_0^2$ to $B_{L-1}^2$ determined by the transformation τ form a second transformed word $W^2$, so that:

$W^1 = B_0^1, B_1^1, \ldots, B_{L-1}^1$ and $W^2 = B_0^2, B_1^2, \ldots, B_{L-1}^2.$ An n-bit byte $C'_i$ read from each of n memory cells is either a codeword of the second error code or not a codeword of the second error code.

If all L n-bit bytes $C'_i$ to $C'_L$ read from the memory are codewords of the second error code, then $W^1 = B_0^1, \ldots, B_{L-1}^1 = W^2 = B_0^2, \ldots, B_{L-1}^2,$ and no error has occurred that would falsify a codeword of the second error code into a non-codeword of the second error code.

In addition, there may be errors that falsify a first codeword $C_j$ of the second error code into a second codeword $C_{j*}$ of the second error code. For example, if the second error code is a 3-from-6 code, the codeword 111000 can be falsified to the codeword 110100 by swapping the third bit and the fourth bit.

Figure 3:
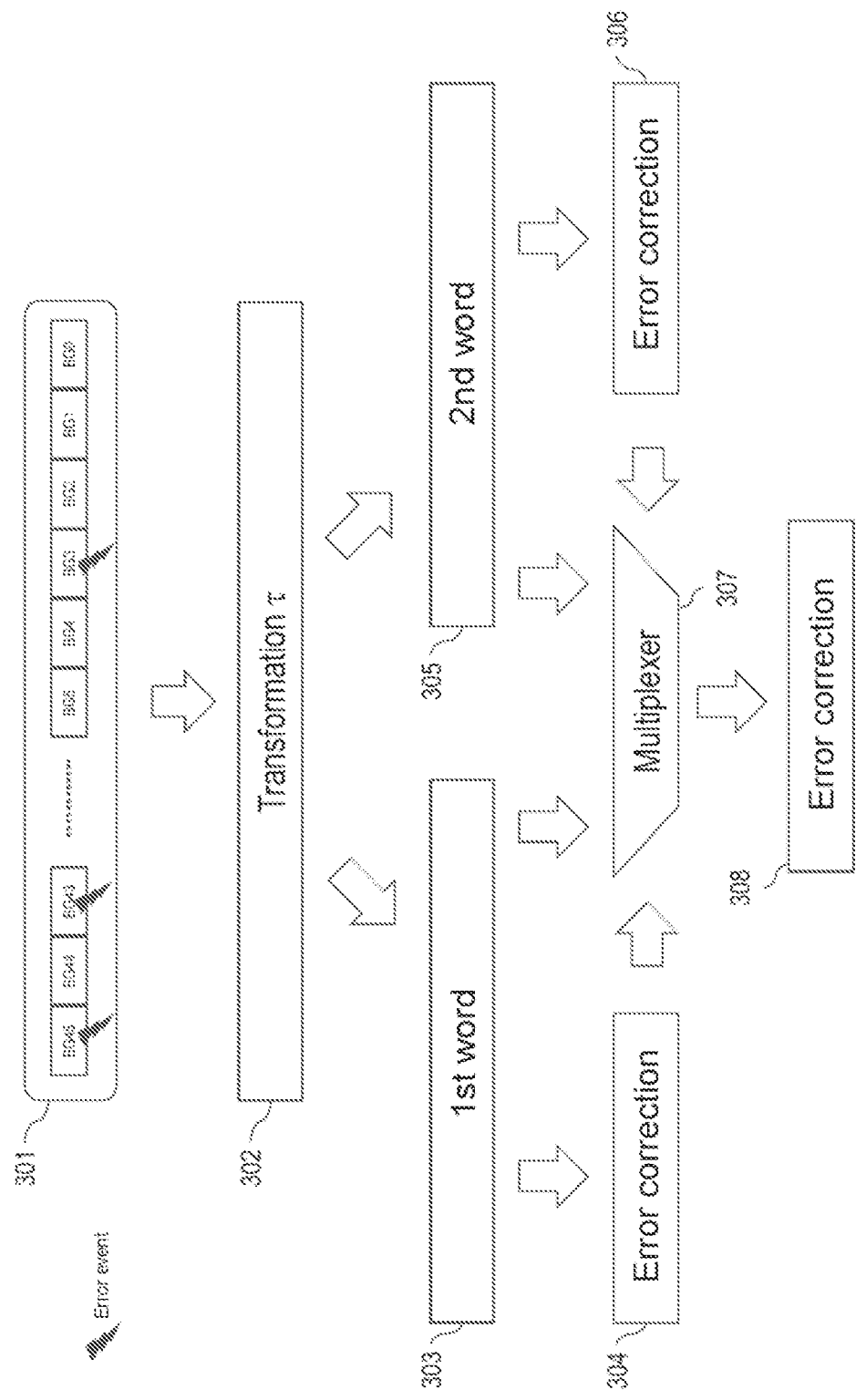
FIG. 3 shows a schematic diagram for illustrating the readout process and in the time domain.

FIG. 3 shows a schematic diagram for processing bit groups BG. Firstly, for example, 46 bit groups BG0 to BG45 are read from a memory 301. Each of the bit groups BG can be a byte with multiple bits. For example, each of the bit groups comprises a number of bits n. Using a transformation τ 302, the individual bit groups BG0 to BG45 read are each transformed into a first word 303 and a second word 305. An error detection 304 for the first word 303 and an error detection 306 for the second word 305 can be carried out and based on these error detections 304, 306 it can be decided whether the first word 303 or the second word 305 is submitted to an error correction 308 via a multiplexer 307. It should be noted here that if one of the words is error-free, the error correction does not need to be carried out. It should also be noted that error detections 304, 306 can be implemented in one or more components.

In the example of FIG. 3, three of the bit groups can be erroneous, e.g. three error events can occur. By splitting into the two words 303, 305 by means of the transformation τ, the following cases can be distinguished:

The first word 303 contains three errors and the second word contains no errors. The second word is used. The error correction 308 can pass through the second word.

The first word 303 contains one error and the second word 305 contains two errors. The first word is used for the error correction 308 and the corrected word is processed further.

The first word 303 contains two errors and the second word 305 contains one error. The second word is used for the error correction 308 and the corrected word is processed further.

The first word 303 contains no errors and the second word 305 contains three errors. The first word is used for the error correction 308. The error correction 308 can pass through the first word.

Option: Readout in the Time Domain

For example, an n-bit byte $C'_i$ can be read out taking into account a time domain, as is described, for example, in U.S. Pat. No. 9,805,771 B2, which is incorporated by reference herein. Using a temporal sequence, for an m-from-n code the m of the n memory cells are determined, for which the values read out first reach a threshold value of a physical value.

If, for example, a low electrical resistance of a memory cell corresponds to the stored binary value 0 and a higher resistance to the stored value 1, then the memory cell in which the binary value 0 is stored has a higher reading current when read out than a memory cell in which the value 1 is stored. The reading current can be integrated (over time) as a voltage by means of a capacitor. The m memory cells which are the first to reach a threshold value of the voltage can be assigned the binary value 0 and the remaining (n−m) memory cells can already be assigned the binary value 1 at this time.

If the m-th and the (m+1)-th bits follow each other closely when an n-bit byte $C'_i$ is read out in the time domain, it is possible that instead of the m fastest bits, the value 0 is assigned to the (m+1) fastest bits in error.

If all (m+1) bits to which the value 0 has been assigned are inverted separately one after another, this results in a set of (m+1) possible codewords of the m-from-n code, of which only one is the correct (unaltered) codeword.

The following applies accordingly:

For a 1-from-2 code, this set comprises 2 possible codewords.

For a 2-from-4 code, this set comprises 3 possible codewords.

For a 3-from-6 code, this set comprises 4 possible codewords.

For a 4-from-8 code, this set comprises 5 possible codewords.

For example, if instead of the 3 fastest bits (for a 3-from-6 code) the 4 fastest bits $c_1, c_2, c_3, c_4$ are erroneously determined, it is unclear which are the correct fastest bits: first of all, any combination of 3 bits from these 4 bits could be considered, e.g.:

$c_1, c_2, c_3$ $c_1, c_2, c_4$ $c_1, c_3, c_4$ $c_2, c_3, c_4$

As an option it is possible additionally to determine the fastest (m−r) bits, where r≥1.

As an example, a 3-from-6 code for r=1 will be considered in the following. If no error occurs, the m=3 fastest bits and the m−1=2 fastest bits are determined.

For example, $C_i = 110100 = c_1 c_2 c_3 c_4 c_5 c_6$ was stored. The temporal sequence of the bits read out is $c_3, c_6, c_5, c_1, c_2, c_4$.

Thus, the three fastest bits are $c_3, c_6, c_5$. The binary value 0 is assigned to them. The binary value 1 is assigned to the remaining bits $c_1, c_2, c_4$.

For example, it is not possible to distinguish between bits that are closely consecutive in time when reading them. This is particularly problematic, for example, in a 3-from-6 code if the third fastest bit and the fourth fastest bit occur together from the point of view of the reading logic, so that four instead of three fastest bits are present after the read operation.

In the above example, therefore, in the event of an error it will be the case that the four fastest bits $c_3, c_6, c_5, c_1$ are determined by the reading logic because the bits $c_5$ and $c_1$ are so closely consecutive in time that they fall into a common sampling window of the reading logic.

In addition to the m=3 fastest bits $c_3, c_6, c_5$, the (m−1=)2 fastest bits $c_3, c_6$ can be determined. The result obtained is that either bit $c_5$ or bit $c_1$ must be the fastest third bit. Thus, only the following combinations are now possible for the 3 fastest bits:

$c_3, c_6, c_5$ $c_3, c_6, c_1$

For completeness it should be noted that the memory cells can also be read using one or more reference values. This is explained by way of an example in U.S. Pat. No. 11,157,352, which is incorporated by reference herein.

FIG. 4 shows a schematic diagram of a possible implementation when reading eight memory cells 401 to 408 by means of corresponding read amplifiers. A block 409 enables the four fastest bits to be determined, and a block 413 enables the three fastest bits to be determined.

For this purpose, each of the blocks 409, 413 contains eight latches 411 (latching registers), which are implemented, for example, as state-controlled flip-flops. In addition to the data input (for the value), the latch 411 has a second input (called enable or gate) that controls the operating mode: During a transparent phase, the output of the latch directly follows the data input. In a hold phase (triggered via the set input, which is activated via a signal 412, 415), the last state is frozen. Furthermore, a logic 410, 414 is provided, which is used to determine the four or three fastest bits from the read memory cells 401 to 408.

With regard to the logic 410, 414, reference should be additionally made to, for example, U.S. Pat. No. 9,805,771 B2 or DE 102018 124296 A1, both of which are incorporated by reference herein.

In the example shown in FIG. 4, instead of the correct bit string 01011001 the bit string 01111001 is read in error, thus instead of the four fastest bits, five are erroneously determined (indicated with 1), because the fourth fastest bit and the fifth fastest bit follow so closely in time that block 409 cannot distinguish (resolve) their chronological sequence.

The additional block 413 enables the detection of the three fastest bits (again indicated with 1): 01011000.

Using block 413, it is thus possible to limit which bits can potentially be selected as the fourth fastest bit. Thus, only the bit string 01111000 or the bit string 01011001 can be correct for the four fastest bits.

Processing the Transformed Words $W^1$ and $W^2$

An n-bit byte $C'_i$ read from n memory cells is assigned a first q-bit byte $B_i^1$ and a second q-bit byte $B_i^2$. A first transformed word $W^1$ and a second transformed word $W^2$ are defined as $W^1 = B_0^1, B_1^1, \ldots, B_{L-1}^1$ and $W^2 = B_0^2, B_1^2, \ldots, B_{L-1}^2$.

It is not known whether the first q-bit byte or the second q-bit byte is error-free.

If $C'_i$ is a codeword of the second error code, then $B_i^1 = B_i^2$. If all n-bit bytes $C'_0$ up to $C'_{L-1}$ are codewords of the second error code, then $W^1 = W^2$.

If no error has occurred, then $W = W^1 = W^2$. In this case, both $W^1$ and $W^2$ are the same codewords of the first error code.

First, it is assumed, as an example, that no error has occurred in which the n-bit byte $C'_j$ was falsified to another codeword of the second error code. Instead, nC-errors are taken into account where corruption has occurred to a non-codeword of the second error code.

If an nC-error occurs, the transformed word $W^1$ and the transformed word $W^2$ are obtained as described above: each byte position i for i=1,2,...,L is assigned two transformed q-bit byte values $B_i^1$ and $B_i^2$. These byte values are not equal if the n-bit byte $C'_i$ read is not a codeword of the second error code and they are equal if $C'_i$ is a codeword of the second error code.

One of these two byte values can be considered to be error-free and the other as an erroneous byte value.

If a 1-byte error occurs in an n-bit byte, the following cases can be distinguished:

$W^1$ does not have an erroneous byte and $W^2$ has an erroneous byte, $W^1$ has an erroneous byte and $W^2$ does not have an erroneous byte.

Thus, either $W^1$ or $W^2$ is error-free. For example, it may be determined by means of corresponding syndrome components of the first error code that either the first word $W^1$ or the second word $W^2$ is error-free, if the corresponding syndrome components for either of the words $W^1$ or $W^2$ are all equal to 0. No correction of the 1-byte error is then necessary, as the error-free word can be selected.

If 2 byte errors occur in the n-bit bytes read from the memory cells, the following cases can be distinguished:

$W^1$ has two erroneous bytes and $W^2$ has no erroneous bytes, $W^1$ has one erroneous byte and $W^2$ has one erroneous byte, $W^1$ has no erroneous bytes and $W^2$ has two erroneous bytes.

Thus, either $W^1$ or $W^2$ has no erroneous byte or one erroneous byte. Thus, a 2-byte error in the n-bit bytes can be corrected using a 1-byte error-correcting code for correcting one of the words $W^1$ or $W^2$ of the q-bit bytes.

If 3 byte errors occur, the following cases can be distinguished:

$W^1$ has three erroneous bytes and $W^2$ has no erroneous bytes,
$W^1$ has two erroneous bytes and $W^2$ has one erroneous byte,
$W^1$ has one erroneous byte and $W^2$ has two erroneous bytes,
$W^1$ has no erroneous bytes and $W^2$ has three erroneous bytes.

Either $W^1$ or $W^2$ has no erroneous bytes or one erroneous byte. Thus, a 3-byte error in the n-bit bytes can be corrected using a 1-byte error-correcting code for correcting one of the words $W^1$ or $W^2$ of the q-bit bytes.

If 4 byte errors occur, the following cases can be distinguished:

$W^1$ has four erroneous bytes and $W^2$ has no erroneous bytes,
$W^1$ has three erroneous bytes and $W^2$ has one erroneous byte,
$W^1$ has two erroneous bytes and $W^2$ has two erroneous bytes,
$W^1$ has one erroneous byte and $W^2$ has three erroneous bytes,
$W^1$ has no erroneous bytes and $W^2$ has four erroneous bytes.

Either $W^1$ or $W^2$ has no, one, or two byte errors. Thus, a 4-byte error in the n-bit bytes can be corrected using a 2-byte error-correcting code for correcting one of the words $W^1$ or $W^2$ of the q-bit bytes.

If 5 byte errors occur, the following cases can be distinguished:

$W^1$ has five erroneous bytes and $W^2$ has no erroneous bytes,
$W^1$ has four erroneous bytes and $W^2$ has one erroneous byte,
$W^1$ has three erroneous bytes and $W^2$ has two erroneous bytes,
$W^1$ has two erroneous bytes and $W^2$ has three erroneous bytes,
$W^1$ has one erroneous byte and $W^2$ has four erroneous bytes,
$W^1$ has no erroneous bytes and $W^2$ has five erroneous bytes.

Either $W^1$ or $W^2$ has no, one, or two erroneous byte errors. Thus, a 5-byte error in the n-bit bytes can be corrected using a 2-byte error-correcting code for correcting one of the words $W^1$ or $W^2$ of the q-bit bytes.

In general, the following applies: if M errors occur in the n-bit bytes, one of the words $W^1$ or $W^2$ has no, one, etc. up to M/2 erroneous byte(s). Here, M/2 denotes the integer division of M by 2. M byte errors in the n-bit bytes can therefore be corrected using an M/2-byte error-correcting code for correcting one of the words $W^1$ or $W^2$ of the q-bit bytes.

If an M-byte error has occurred in the n-bit bytes, then the first word $W^1$ of the q-bit bytes has an $M_1$-byte error and the second word $W^2$ of the q-bit bytes has an $M_2$-byte error, where the following is true:

$$M_1+M_2=M \text{ and } 0 \leq M_1, M_2 \leq M/2.$$

For example, the following scenarios may occur:

The word $W^1$ has no byte errors: it is not necessary to determine how many byte errors the word $W^2$ has, since the word $W^1$ is already error-free, it can be used without correction.

The first word $W^1$ has a 1-byte error and no 2-byte errors: the first word can be corrected using the first error code. It is then not necessary to check the second word $W^2$.

The second word $W^2$ has a 1-byte error and no 2-byte errors: the second word can be corrected using the first error code. It is then not necessary to check the first word $W^1$.

If M=3, it is sufficient that the first error code can correct 1-byte errors and detect 2-byte errors: for example, if a 3-byte error exists in the word $W^1$ then the word $W^2$ is error-free. This can be uniquely identified by the fact that all components of the error syndrome of $W^2$ are equal to 0. A 3-byte error in $W^1$ does not need to be detected, because for the 3-byte error in the word $W^1$ the word $W^2$ is error-free and the word $W^2$ can be used without correction, regardless of whether and what kind of error occurred in $W^1$.

If M=4 and a 1-byte error-correcting and 2-byte error-detecting error code is used, then 1-byte errors, 2-byte errors and 3-byte errors are corrected, because for these errors, either the first word $W^1$ or the second word $W^2$ has no or (only) one byte error.

For example, if a 4-byte error occurs, then for example $W^1$ will have either no byte errors, a 1-byte error or a 2-byte error. If there is no byte error in $W^1$, then $W^1$ does not need to be corrected. If a 1-byte error occurs in $W^1$, the error in $W^1$ can be corrected. The number of errors in $W^2$ is then irrelevant and does not need to be determined. If $W^1$ has a 2-byte error, then in the case of a 4-byte error $W^2$ also has a 2-byte error. If an error code is used that can only correct 1-byte errors, then the 2-byte errors in Wand $W^2$ are recognized as non-correctable errors and no correction is made. If the result of the 4-byte error is that $W^1$ has no byte errors and $W^2$ has four byte errors, or that $W^1$ has one byte error and $W^2$ has three byte errors, the 4-byte error is then corrected correctly. Thus, the 4-byte error is either detected (if $W^1$ and $W^2$ each have two byte errors) or corrected.

In general, the correction of an error with M erroneously read n-bit values, in which M of the n-bit bytes read from the respective n memory cells are not a codeword of the second error code, can be carried out by correcting an error with a maximum of M/2 byte errors in one of the transformed words $W^1$ or $W^2$ using the first error code.

The number of components of the error syndrome required and hence the number of bits required to be stored in memory cells can be reduced using the approach proposed here.

General Description of Reed-Solomon Codes

For example, known Reed-Solomon codes can be used as byte-error-correcting codes. For Reed-Solomon codes, reference should be made to [Lin, S., Costello, D.: Error Control Coding, Prentice Hall, 1983, pages 170 to 177] or [Wicker, S.: Error Control Systems for Digital Communication and Storage, Prentice Hall, 1995, pages 214 to 224].

For Reed-Solomon codes, error detection and differentiation between different errors can be carried out using error syndrome components (also referred to as syndrome components)

$s_1, s_2, s_3$

The number of detectable and distinguishable errors is determined by the fact that corresponding determinants from the syndrome components are equal to 0 or not equal to 0.

For a 1-byte error, the following applies:

$$\text{Det}\begin{pmatrix} s1 & s2 \\ s2 & s3 \end{pmatrix} = s_1 s_3 + s_2^2 = 0 \tag{1}$$

For a 2-byte error, the following applies:

$$\text{Det}\begin{pmatrix} s1 & s2 \\ s2 & s3 \end{pmatrix} = s_1 s_3 + s_2^2 \neq 0 \tag{2}$$

and $$\text{Det}\begin{pmatrix} s1 & s2 & s3 \\ s2 & s3 & s4 \\ s3 & s4 & s5 \end{pmatrix} = s_1 s_3 s_5 + s_3^3 + s_4^2 s_1 + s_2^2 s_5 = 0 \tag{3}$$

To calculate the determinant according to equation (3) requires 5 error syndrome components $s_1$ to $s_5$ and 3!=6 terms in the Galois field $GF(2^q)$, where two of the six terms $s_2 s_3 s_4$ are identical and therefore cancel out (because doubly-occurring terms in the Galois field $GF(2^q)$ add up to 0).

For a 3-byte error, the following applies:

$$\text{Det}\begin{pmatrix} s1 & s2 & s3 \\ s2 & s3 & s4 \\ s3 & s4 & s5 \end{pmatrix} = s_1 s_3 s_5 + s_3^3 + s_4^2 s_1 + s_2^2 s_5 \neq 0 \tag{4}$$

and $$\text{Det}\begin{pmatrix} s_1 & s_2 & s_3 & s_4 \\ s_2 & s_3 & s_4 & s_5 \\ s_3 & s_4 & s_5 & s_6 \\ s_4 & s_5 & s_6 & s_7 \end{pmatrix} = 0.$$

To calculate the determinant according to equation (4), 7 error syndrome components $s_1$ to $s_7$ are required and this results in 4!=24 terms in the Galois field $GF(2^q)$.

If the errors are determined or differentiated using this approach, then in order to distinguish between
2-byte errors, 3 syndrome components and 3 check bytes,
3-byte errors, 5 syndrome components and 5 check bytes,
4-byte errors, 7 syndrome components and 7 check bytes
of the Reed-Solomon code are necessary.

The approach presented here allows the reduction of the necessary syndrome components or check bytes. This is shown in the following example, firstly based on the correction of only a 1-byte error using the words $W^1$ and $W^2$ introduced above:

For example, if there are 3 erroneous n-bit bytes present, the following applies:
Either the first word $W^1$ has no error or a 1-byte error, while the second word $W^2$ has either a 3-byte error or a 2-byte error, or
either the second word $W^2$ has no error or a 1-byte error, while the first word $W^1$ has either a 3-byte error or a 2-byte error.

The correction is then made for the word that has no error or only the 1-byte error.

A distinction is made between whether the first word $W^1$ has no or one byte error, or whether the second word $W^2$ has no error or one byte error. If both words have no or one byte error, a distinction is not necessary. If one of the words is error-free, it can be used without correction.

The following applies to the 1-byte error:

$$s_1 s_3 + s_2^2 = 0 \tag{5}$$

$$s_1 s_4^2 + s_3^3 = 0. \tag{6}$$

This can be verified as follows: By inserting $$s_1 = \alpha$$

$$s_2 \alpha^i a$$

$$s_3 = \alpha^{2i} a$$

$$s_4 = \alpha^{3i} a$$

into equations (5) and (6), it follows that:

$$a\alpha^{2i} a + (\alpha^i a)^2 = \alpha^{2i} a^2 + \alpha^{2i} a^2 = 0$$

$$a(\alpha^{3i} a)^2 + (\alpha^{2i} a)^3 \alpha a^{6i} a^2 + \alpha^{6i} a^3 = 0.$$

In this case, a denotes a byte error value in the i-th byte and a the position of the byte.

If the equations (5) and (6) are valid, then there can be no 3-byte error, since it then follows that:

$$\text{Det}\begin{pmatrix} s1 & s2 & s3 \\ s2 & s3 & s4 \\ s3 & s4 & s5 \end{pmatrix} = s_1 s_3 s_5 + s_3^3 + s_4^2 s_1 + s_2^2 s_5 = \ldots + \ldots 0$$

This term is therefore independent of $s_5$. Thus, the syndrome component $s_5$ is not required to distinguish a 1-byte error from a 3-byte error. This means that the q bits of the fifth check byte of the Reed-Solomon code can be saved. Accordingly, check bytes can be saved if a larger number of bytes are to be corrected.

A 3-byte error can only occur if:

$$s_1 s_3 + s_2^2 \neq 0, \tag{7}$$

$$s_1 s_4^2 + s_3^3 \neq 0 \tag{8}$$

For a 2-byte error, according to equation (2)

$$s_1 s_3 + s_2^2 \neq 0.$$

It follows that a 1-byte error but no 2-byte error or 3-byte error may be present if equations (5) and (6) apply. If, on the other hand, equations (7) and (8) apply, then there is no 1-byte error present.

A 0-byte error can be detected by the fact that the syndrome components $s_1$, $s_2$, $s_3$ are equal to 0.

Example: 1-Byte Correction with 3 Check Bytes

In the following, $s_1, s_2, s_3, \ldots$ are the error syndrome components of the first word $W^1$ and $s'_1, s'_2, s'_3, \ldots$ are the syndrome components of the second word $W^2$.

In the present example, there are three check bytes for each of the words $W^1$ and $W^2$ and hence three syndrome components $s_1, s_2, s_3$ or $s'_1, s'_2, s'_3$.

The following cases are considered as examples of possible errors:

3 nC-Errors

The first word has no byte errors, and the second word has 3 byte errors. For the first word $$s_1 V s_2 V s_3 = 0,$$

For the second word $$s'_1 Vs'_2 Vs'_3 \neq 0$$

and the first word is used without correction.

The first word has 1 byte error, and the second word has 2 byte errors. For the first word $$s_1 s_3 + s_2^2 = 0,$$

for the second word $$s'_1 s'_3 + s'^2_2 \neq 0$$

and the first word is corrected.

The first word has 2 byte errors, and the second word has 1 byte error. The second word is corrected.

The first word has 3 byte errors, and the second word has no byte errors. The second word is used without correction.

2 nC-Errors the first word has no byte errors, and the second word has two byte errors.

For the first word $$s_1 Vs_2 Vs_3 = 0$$

and the first word is used without correction.

The first word and the second word have one byte error each. For the first word $$s_1 s_3 + s_2^2 = 0$$

and the same applies to the second word $$s'_1 s'_3 + s'^2_2 = 0.$$

The first word (or the second word) is corrected.

1nC-Error

The first word has no byte errors, and the second word has one byte error. For the first word $$s_1 Vs_2 Vs_3 = 0$$

and the first word is used without correction.

The second word has no byte error, and the first word has one byte error. For the second word $$s'_1 Vs'_2 Vs'_3 = 0$$

and the second word is used without correction.

1 fC-Error

The first word and the second word have the same byte error. For the first word $$s_1 s_3 + s_2^2 = 0,$$

for the second word $$s'_1 s'_3 + s'^2_2 \le 0.$$

and the first word (or the second word) is corrected.

1 nC-Error and 1 fC-Error

The first word has 1 byte error, and the second word has 2 byte errors. For the first word $$s_1 s_3 + s_2^2 = 0,$$

for the second word $$s'_1 s'_3 + s'^2_2 \neq 0$$

and the first word is corrected.

The first word has 2 byte errors, and the second word has 1 byte error. The second word is corrected.

2 fC-errors are always detected and no correction is performed.

Example: 1-Byte Correction with 4 Check Bytes

This example assumes that a maximum of 3 nC-errors and a maximum of 1 fC-error occur. A 1-byte-error correction is used for the error correction.

The error syndrome components result in four check bytes, which are also stored. After read-out, the error syndrome components $s_1, s_2, s_3, s_4$ of the Reed-Solomon code for the first word and the error syndrome components $s'_1, s'_2, s'_3, s'_4$ of the Reed-Solomon code for the second word are formed. The Galois field used here is $GF(2^q)$ with, for example, $q=6$ and the syndrome components are each $q=6$-dimensional binary vectors. This means that 4 check bytes or $4 \cdot q = 24$ check bits are used.

It should be noted here that for the byte-error correction, although up to 3 byte errors can occur, by properly selecting the word to be corrected, only a maximum of a single byte must be corrected: either the first word or the second word is corrected in at most one byte position.

For these syndrome components of the first word and the second word, the following relationships are checked:

$$s_1 s_3 + s_2^2 \stackrel{?}{=} 0, \qquad (9)$$

$$s1 s_4^2 + s_3^3 \stackrel{?}{=} 0 \qquad (10)$$

$$s_1 Vs_2 Vs_3 Vs_4 \stackrel{?}{=} 0 \qquad (11)$$

$$s'_1 s'_3 + s'^2_2 \stackrel{?}{=} 0, \qquad (12)$$

$$s'_1 s'^2_4 + s'^3_3 \stackrel{?}{=} 0, \qquad (13)$$

$$s'_1 Vs'_2 Vs'_3 Vs'_4 \stackrel{?}{=} 0 \qquad (14)$$

Based on these equations it is determined for the first word or the second word whether no correction is required or a 1-byte correction is performed or an uncorrectable error was detected.

The processing of the first word based on the above equations (9), (10) and (11) is described below as an example. If according to equation (11)

$$s_1 Vs_2 Vs_3 Vs_4 = 0,$$

then there is no error in the first word.

If according to equations (9) and (10)

$$s_1 s_3 + s_2^2 = 0,$$

$$s_1 s_4^2 + s_3^3 = 0$$

and if $$s_1 Vs_2 Vs_3 Vs_4 \neq 0,$$

then the first word has a 1-byte error, which can be corrected by means of the 1-byte error correction.

If according to equation (9)

$$s_1 s_3 + s_2^2 \neq 0,$$

then a 2-byte error or a 3-byte error is present. The first word cannot be corrected.

Accordingly, for the second word based on the above equations (12), (13) and (14):

If $$s'_1 Vs'_2 Vs'_3 Vs'_4 = 0,$$

then there is no error in the second word.

If $$s'_1 s'_3 + s'^2_2 = 0,$$

$$s'_1 s'^2_4 + s'^3_3 = 0$$

and if $$s'_1 \vee s'_2 \vee s'_3 \vee s'_4 \neq 0,$$

then the second word has a 1-byte error, which can be corrected by means of the 1-byte error correction.

If $$s'_1 s'_3 + s'^2_2 \neq 0,$$

then a 2-byte error or a 3-byte error is present and the second word cannot be corrected.

Error Analysis in Detail

If there is no error present, no error is indicated in either of the words. For example, further processing can then be carried out based on the first word (or the second word).

If there is 1 nC-error, then no error is indicated in one of the words, e.g.

$$s_1 \vee s_2 \vee s_3 \vee s_4 = 0 \text{ and } s'_1 \vee s'_2 \vee s'_3 \vee s'_4 \neq 0$$

or $$s_1 \vee s_2 \vee s_3 \vee s_4 \neq 0 \text{ and } s'_1 \vee s'_2 \vee s'_3 \vee s'_4 \neq 0$$

The correct word is forwarded.

If there is 1 fC-error, then the first and second words have a 1-byte error, e.g.

$$s_1 \vee s_2 \vee s_3 \vee s_4 \neq 0 \text{ and } s'_1 \vee s'_2 \vee s'_3 \vee s'_4 \neq 0$$

For the first word $$s_1 s_3 + s^2_2 = 0,$$

$$s_1 s^2_4 + s^3_3 = 0,$$

and for the second word $$s'_1 s'_3 + s'^2_2 = 0,$$

$$s'_1 s'^2_4 + s'^3_3 = 0.$$

For example, the 1-byte correction is made for the first word.

For 2 nC-errors, the following situations are possible:

One of the words is error-free and the other word has a 2-byte error. The word for which the OR-operation of the syndromes according to equation (11) or equation (14) is equal to 0 is forwarded.

Both words have a 1-byte error. For example, the first word is corrected.

For 1 fC-error and 1 nC-error, the following applies: One of the words (in this example the first word) has the fC-error, the other word has the fC-error and the nC-error. It is then true for the first word (according to the present example) that $$s_1 s_3 + s^2_2 = 0,$$

$$s_1 s^2_4 + s^3_3 = 0$$

and for the second word $$s'_1 s'_3 + s'^2_2 \neq 0.$$

The first word is corrected.

If in the case of 3 nC-errors one of the words has no error, then this word can be forwarded. It is also possible that one of the words has a 1-byte error and the other has a 2-byte error. In this case, the word with the 1-byte error is corrected and forwarded.

For 2 nC-errors and 1 fC-error, the following situations are possible:

One word (for example, the first word) has 1 byte error, the other word has 3 byte errors. For the first word (e.g. the 1-byte error)

$$s_1 s_3 + s^2_2 = 0$$

$$s_1 s^2_4 + s^3_3 = 0,$$

b. where the following do not apply to the 3-byte error:

$$s'_1 s'_3 + s'^2_2 = 0,$$

$$s'_1 s'^2_4 + s'^3_3 = 0,$$

c. Therefore the first word is corrected.

Both the first and second words contain two byte errors. This can be detected if the following two conditions are satisfied:

$$s_1 s_3 + s^2_2 \neq 0 \text{ and}$$

$$s'_1 s'_3 + s'^3_3 = 0.$$

No correction is possible. So if there are 2 nC-errors and 1 fC-error present, an uncorrectable error is indicated in 50% of cases, in the other 50% of cases it is corrected properly.

Example: 2-Byte Correction with 5 Check Bytes

As an example, the following section considers the case in which up to 5 nC-errors are present and 5 syndrome components $s_1, s_2, s_3, s_4, s_5$ of a Reed-Solomon code can be determined, which are available for correction and/or error detection.

The example Reed-Solomon code considered here should be able to correct 1 byte error or 2 byte errors.

For a Reed-Solomon code, it is generally known to determine the number of errors that have occurred using its syndrome components. For example, to detect whether a 4-byte error is present, a determinant Det(4) can be defined as a function of 7 syndrome components $s_1$ to $s_7$ and a determinant Det(5) as a function of 9 syndrome components $s_1$ to $s_9$.

For a 4-byte error, then $$\text{Det}(4) = \text{Det}\begin{pmatrix} s_1 & s_2 & s_3 & s_4 \\ s_2 & s_3 & s_4 & s_5 \\ s_3 & s_4 & s_5 & s_6 \\ s_4 & s_5 & s_6 & s_7 \end{pmatrix} \neq 0. \qquad (15)$$

and $$\text{Det}(5) = \text{Det}\begin{pmatrix} s_1 & s_2 & s_3 & s_4 & s_5 \\ s_2 & s_3 & s_4 & s_5 & s_6 \\ s_3 & s_4 & s_5 & s_6 & s_7 \\ s_4 & s_5 & s_6 & s_7 & s_8 \\ s_5 & s_6 & s_7 & s_8 & s_9 \end{pmatrix} = 0. \qquad (16)$$

Thus, a 4-byte error occurs if Det(4)≠0 and Det(5)=0.

The effort required to detect the 4-byte error is high, as this requires 9 syndrome components and thus 9 check bytes of the Reed-Solomon code with values from the Galois field $GF(2^q)$. Each syndrome component in this case contains q bits.

In accordance with the approach presented here, however, a significant simplification is possible by using only 5 syndrome components, e.g. only 5 check bytes.

Thus the total number of byte errors that occurred is split between two words: one of the two words thus has a maximum of two of the five byte errors. The error code used as an example allows the correction of up to two byte errors. By splitting into two words, up to 5 byte errors can therefore be corrected with an error code that can correct at most two byte errors.

In the following, a possible division of the 5 byte errors between the two words is described, whereby, for example, the number of errors in the first word is less than or equal to the number of errors in the second word.

This procedure can be used if the number of errors in the second word is less than or equal to the number of errors in the first word.

The error combinations can be differentiated using the 5 syndrome components $s_1, s_2, s_3, s_4$ and $s_5$ of the first word (or $s'_1, s'_2, s'_3, s'_4$ and $s'_5$ of the second word), without the need to determine further syndrome components.

Table 2 shows possible error combinations for a maximum of 5 byte errors. An alternative notation for the respective error combination is $(E_1, E_2)$, where $E_1$ indicates the number of errors in the first word and $E_2$ indicates the number of errors in the second word.

TABLE 2

Error combinations with a maximum of 5 byte errors
Number of errors

| in first word | in second word |
| --- | --- |
| 0 | 1 |
| 0 | 2 |
| 0 | 3 |
| 0 | 4 |
| 0 | 5 |
| 1 | 1 |
| 1 | 2 |
| 1 | 3 |
| 1 | 4 |
| 2 | 2 |
| 2 | 3 |

For the error combinations $(0, E_2)$ with $E_2=1, \ldots, 5$ the first word contains no errors. This can be determined on the basis of the syndrome components. In this case:

$$s_1 \vee s_2 \vee s_3 \vee s_4 \vee s_5 = 0.$$

The first word can be further processed unchanged. It is not necessary to additionally determine whether there is an error in the second word or how many byte errors are present in the second word.

If both the first word and the second word have at least one byte error, the following applies:

$$s_1 \vee s_2 \vee s_3 \vee s_4 \vee s_5 \neq 0 \text{ and}$$

$$s'_1 \vee s'_2 \vee s'_3 \vee s'_4 \vee s'_5 \neq 0$$

A 1-byte error in the first word can be differentiated from a 2-byte error in the first word using $$s_1 s_3 + s_2^2 = A$$

with $A=0$ for the 1-byte error and $A \neq 0$ for the 2-byte error.

A 1-byte error or a 2-byte error in the first word can be differentiated from a 3-byte error in the first word using $$s_1 s_3 s_5 + s_3^3 + s_1 s_4^2 + s_2^2 s_5 = B \quad (17)$$

with $B=0$ for the 1-byte error and the 2-byte error and $B \neq 0$ for the 3-byte error.

Furthermore, a 1-byte error in the first word can be differentiated from a 4-byte error: if a 1-byte error is present, the following applies $$s_1 s_3 + s_2^2 = 0 \text{ and } s'_1 s_4^2 + s_3^3 \leq 0 \quad (18)$$

And furthermore $$s_1 s_3 s_5 + s_3^3 + s_1 s_4^2 + s_2^2 s_5 = 0 \quad (19)$$

as otherwise there would be a 3-byte error.

From equation (18) B=0 follows for equation (17) and there can be no 3-byte error present if equation (18) is satisfied.

Furthermore, a 4-byte error is present if the determinant $\text{Det}(4) \neq 0$.

The determinant $\text{Det}(4)$ from equation (15) can be determined as follows (development according to the second column):

$$\text{Det}(4) = \text{Det}\begin{pmatrix} s_1 & s_2 & s_3 & s_4 \\ s_2 & s_3 & s_4 & s_5 \\ s_3 & s_4 & s_5 & s_6 \\ s_4 & s_5 & s_6 & s_7 \end{pmatrix} ==$$

$$s_3 \cdot s_2 \cdot (s_4 \cdot s_7 - s_6 \cdot s_5) - s_5 \cdot s_2 \cdot (s_2 \cdot s_7 - s_4 \cdot s_5) + + s_6 \cdot s_2 \cdot (s_2 \cdot s_6 - s_4^2) +$$

$$s_1 \cdot s_3 \cdot (s_5 \cdot s_7 - s_6^2) - - (s_3^2 \cdot (s_3 \cdot s_7 - s_6 \cdot s_4)) + s_4 \cdot s_3 \cdot (s_3 \cdot s_6 - s_5 \cdot s_4) - -$$

$$(s_1 \cdot s_4 \cdot (s_4 \cdot s_7 - s_6 \cdot s_5)) + s_3 \cdot s_4 \cdot (s_2 \cdot s_7 - s_4 \cdot s_5) - - (s_4^2 \cdot (s_2 \cdot s_6 - s_4^2)) +$$

$$s_1 \cdot s_5 \cdot (s_4 \cdot s_6 - s_5^2) - - (s_2 \cdot s_5 \cdot (s_3 \cdot s_6 - s_5 \cdot s_4)) + s_3 \cdot s_5 \cdot (s_3 \cdot s_5 - s_4^2)$$

In the Galois field considered here, equal terms add up to 0 and "−" can be equated with "+". After multiplying out and taking into account equations (18) and (19), the result obtained is:

$$\text{Det}(4) = s_7 \cdot \underbrace{(s_2^2 s_5 + s_1 s_3 s_5 + s_3^2 + s_1 s_4^2)}_{=0} +$$

$$s_6^2 \cdot \underbrace{(s_2^2 + s_1 s_3)}_{=0} + + s_5^2 \cdot (s_1 s_5 + s_3^2) + s_4^2 \cdot (s_4^2 + s_3 s_5)$$

So for the determinant $\text{Det}(4)$ it follows that:

d.

$$\text{Det}(4) = s_5^2 \cdot (s_1 s_5 + s_3^2) + s_4^2 \cdot (s_4^2 s_3 s_5) \quad (20)$$

The determinant according to equation (20) does not depend on the syndrome components $s_6$ or $s_7$. Only 5 syndrome components and hence only 5 check bytes are required to differentiate a 1-byte error in the first word from a 4-byte error.

If equation (20) equals 0, there can be no 4-byte error present. This can be determined solely using the error syndromes $s_1$ to $s_5$.

The case where instead of a 1-byte error or another error in the first word, a 5-byte error has occurred in the first word, is detected from the fact that whenever there is a 5-byte error in the first word there is a 0-byte error in the second word, which is detected based on the condition $$s'_1 \vee s'_2 \vee s'_3 \vee s'_4 \vee s'_5 = 0$$

for the syndrome components of the second word.

A maximum of a 2-byte correction is required for one of the words to correct up to 5 nC-errors.

For this example, the following is a summary of how the different errors in the first word can be determined:

0 byte errors in the first word:

$s_1 V s_2 V s_3 V s_4 V s_5 = 0$ 1 byte error in the first word:

$s_1 V s_2 V s_3 V s_4 V s_5 \neq 0$ $s_1 s_3 + s_2^2 = 0$ $s'_1 s_4^2 + s_3^3 = 0$ $s_1 s_3 s_5 + s_3^3 + s_1 s_4^2 + s_2^2 s_5 = 0$ $Det(4) = s_5^2 \cdot (s_1 s_5 + s_3^2) + s_4^2 \cdot (s_4^2 + s_3 s_5) = 0$ 2 byte errors in the first word:

$s_1 V s_2 V s_3 V s_4 V s_5 16\ 0$ $s_1 s_3 + s_2^2 \neq 0$ $s_1 s_3 s_5 + s_3^3 + s_1 s_4^2 + s_2^2 s_5 \neq 0$ 3 byte errors in the first word:

$s_1 s_3 s_5 + s_3^3 + s_1 s_4^2 + s_2^2 s_5 \neq 0$ 4 byte errors in the first word:

$Det(4) = s_5^2 \cdot (s_1 s_5 + s_3^2) + s_4^2 \cdot (s_4^2 + s_3 s_5) \neq 0$ 5 byte errors in the first word:

$s'_1 V s'_2 V s'_3 V s'_4 V s'_5 = 0$

In this example, only a 1-byte error or a 2-byte error in a word can be corrected due to the error code used. If there are more than 2 byte errors in the word, correction is not possible.

The transformation τ described herein of a word C' that may have been incorrectly read from the memory into the two words $W^1$ and $W^2$ makes it possible to correct a 1-byte error or a 2-byte error for each of the words $W^1$ or $W^2$. According to the present example, if a maximum of 5 byte errors occur in the read word, these errors are distributed between the two words $W^1$ and $W^2$ as shown in Table 2. Due to the combined consideration of the two words $W^1$ and $W^2$, as a result of the transformation τ it is possible to correct up to 5 byte errors in the combined word C. In doing so it is sufficient to correct one of the words $W^1$ or $W^2$. Accordingly, it is sufficient to detect that at least one of the words has 3 byte errors: in this case, the other word can be corrected.

FIG. 2 shows a schematic diagram for visualizing an exemplary implementation of the error correction (in this case, reference is made to the above-cited cases (a) to (f)):

Step 201: It is checked whether the first word is error-free. If this is the case, the first word is used.

Step 202: If the first word is not error-free, it is checked whether the second word is error-free. If the second word is error-free, this second word is used.

Step 203: If the first and second words are not error-free, it is determined whether there is a 1-byte error in the first word. For this purpose, the 1-byte error must be distinguished from the 2-byte error, the 3-byte error and the 4-byte error. This is shown in the above case (b): if these conditions are satisfied, a 1-byte error and no other (detectable and correctable) error is present, the 1-byte error in the first word is corrected and the first corrected word is used.

Step 204: If the previous step shows that there is no 1-byte error present, it has also been shown whether a 2-byte error, a 3-byte error or a 4-byte error is present instead. If a 2-byte error is present, this 2-byte error is corrected in the first word and the first word is used.

Step 205: If a 3-byte error or a 4-byte error is present in the first word, this cannot be corrected (in the first word). However, since there should be no more than 5 byte errors, a maximum of one 2-byte error or one 1-byte error may have occurred in the second word. If there is a 3-byte error or a 4-byte error is present in the first word, the second word is corrected and used.

Step 206: If there is a 5-byte error present in the first word, the second word is error-free and can therefore be used. This is already taken into account in step 202.

It should be noted that these steps are only an exemplary implementation. It is possible to check at least a portion of the conditions shown in the above-cited cases (a) to (f) in parallel or partially in parallel for the two words $W^1$ and $W^2$, in order to perform a fast and efficient correction, if necessary. For example, the word that is error-free or that is or can be corrected more quickly can be used. If one of the words $W^1$ and $W^2$ has been determined to be error-free, it can be used (immediately), regardless of possible errors in the other word. Accordingly, the word that has been corrected can be used (regardless of possible errors in the other word). Implementations for checking for errors and any correction of errors can be implemented in hardware or software or in combinations of hardware and software.

What is claimed is:

1. A method for correcting errors in a string of symbols, comprising:
   generating, via a processing unit, a codeword of a second error code from a codeword of a first error code;
   storing, via the processing unit, the codeword of the second error code in a memory coupled to the processing unit;
   reading, via the processing unit, bits from the memory, the bits corresponding to information included in the string of symbols;
   detecting, via the processing unit, whether an error is present in the bits corresponding to the information included in the string of symbols based on whether the bits correspond to the codeword of the second error code;
   generating, via the processing unit, a first group of symbols and a second group of symbols from the string of symbols in response to detecting the error, wherein the first group of symbols has fewer erroneous symbols than the second group of symbols; and
   correcting, via the processing unit, the first group of symbols using the first error code.

2. The method of claim 1, wherein the first error code is a byte-error-correcting error code.

3. The method of claim 2, wherein the first error code is an N byte-error-correcting Reed-Solomon code over a Galois field $GF(2^q)$, where q is a number of bits of a symbol read out from the first group of symbols and the second group of symbols.

4. The method of claim 1, wherein each of the symbols in the string of symbols comprises at least one of:
   a byte,
   a multi-valued component, or
   a value from a specified value range.

5. The method of claim 1, wherein the symbols comprise the codeword of the first error code.

6. The method of claim 5, further comprising:
in response to detecting the error, generating the first group of symbols and the second group of symbols based on the codeword of the second error code.

7. The method of claim 5, further comprising:
in response to detecting the error, generating the first group of symbols and the second group of symbols based on the codeword of the second error code, which has a distance of less than 3 positions from a nearest symbol of the erroneous symbols.

8. The method of claim 7, wherein the codeword of the second error code, differs from an erroneous symbol by only one bit.

9. The method of claim 8, the codeword of the second error code, has a minimum Hamming distance from the erroneous symbol.

10. The method of claim 1, wherein the second error code is a parity code or an m-from-n code with 1≤m<n.

11. The method of claim 1, wherein the string of symbols is transformed into the first group of symbols and into the second group of symbols, the first group of symbols being different from the second group of symbols, when a symbol of the string of symbols is not the codeword of the second error code and at least one error is present.

12. The method of claim 1, further comprising:
determining a first error syndrome for the first group of symbols and a second error syndrome for the second group of symbols; and
determining whether the first group of symbols or the second group of symbols is corrected based on at least one of: the first error syndrome or the second error syndrome.

13. A computer program product, configured to be loaded directly into a memory of a digital computer, comprising program code configured to carry out the method of claim 1.

14. A device for error correction in a string of symbols, comprising:
a memory;
at least one transformation circuit; and
a processor coupled to an input and an output of the memory and to the transformation circuit, the processor configured to:
generate, via the at least one transformation circuit, a codeword of a second error code from a codeword of a first error code;
store the codeword of the second error code in the memory;
read bits from the memory, the bits corresponding to information included in the string of symbols;
detect whether an error is present in the bits corresponding to the information included in the string of symbols based on whether the bits correspond to the codeword of the second error code;
generate, via the at least one transformation circuit, a first group of symbols and a second group of symbols from the string of symbols in response to detecting the error, wherein the first group of symbols comprises fewer errors than the second group of symbols; and
correct the first group of symbols based on the first error code.

15. The device for error correction as claimed in claim 14, wherein the processor is further configured to generate, via the at least one transformation circuit, the first group of symbols and the second group of symbols based on a time domain and an error distance between the error and a nearest symbol of the codeword of the second error code.

16. A system for correcting errors in a string of symbols, the system comprising:
a memory;
at least one transformation circuit; and
a processor coupled to an input and an output of the memory and to the transformation circuit, the processor configured to:
read bits from the memory, the bits corresponding to information included in the string of symbols;
detect whether an error is present in binary data bits read from the memory based on whether the bits correspond to a codeword of a second error code stored in the memory, wherein the codeword of the second error code is derived from a codeword of a first error code;
generate, via the at least one transformation circuit, first symbols of a first q-bit byte and second symbols of a second q-bit byte from the string of symbols, in response to detecting the error, wherein q is equal to or greater than 2, and wherein the first symbols of the first q-bit byte comprise fewer erroneous symbols than the second symbols of the second q-bit byte; and
correct the first symbols of the first q-bit byte based on the first error code.

17. The system of claim 16, wherein the processor is further configured to:
determine a first error syndrome for the first symbols of the first q-bit byte and a second error syndrome for the second symbols of the second q-bit byte; and
determine whether the first symbols of the first q-bit byte or the second symbols of the second q-bit byte are correctable based on at least one of: the first error syndrome or the second error syndrome.

18. The system of claim 16, wherein the processor is further configured to:
determine whether the string of symbols comprises the codeword of the second error code or a non-codeword of the second error code based on the first symbols of the first q-bit byte and the second symbols of the second q-bit byte.

19. The system of claim 18, wherein the processor is further configured to:
assign the string of symbols to a set of different codewords of the second error code in response to determining that the string of symbols is the non-codeword of the second error code.

20. The system of claim 16, wherein the first error code comprises a Reed-Solomon code that corrects byte errors and the second error code comprises a parity code or an m-from-n code with 1≤m<n.

* * * * *